(12) United States Patent
Ichiroku

(10) Patent No.: US 8,617,705 B2
(45) Date of Patent: Dec. 31, 2013

(54) ADHESIVE COMPOSITION AND SHEET FOR FORMING SEMICONDUCTOR WAFER-PROTECTIVE FILM

(75) Inventor: Nobuhiro Ichiroku, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 304 days.

(21) Appl. No.: 13/033,282

(22) Filed: Feb. 23, 2011

(65) Prior Publication Data

US 2011/0223420 A1 Sep. 15, 2011

(30) Foreign Application Priority Data

Mar. 15, 2010 (JP) ................................. 2010-057224

(51) Int. Cl.
*B32B 27/38* (2006.01)
*B32B 27/18* (2006.01)
*C09J 163/00* (2006.01)
*C09J 183/04* (2006.01)

(52) U.S. Cl.
USPC .................... 428/355 EP; 428/413; 428/429; 525/476; 525/524; 525/525; 523/451; 523/461

(58) Field of Classification Search
USPC ......... 428/355 R, 355 EP, 413, 429; 523/400, 523/451, 461; 525/474, 476, 523, 524, 525, 525/526, 528
See application file for complete search history.

(56) References Cited

U.S. PATENT DOCUMENTS

| 2002/0137309 A1 | 9/2002 | Senoo et al. |
| 2008/0131639 A1 | 6/2008 | Yamamoto et al. |

FOREIGN PATENT DOCUMENTS

| CN | 1836021 A | 9/2006 | | |
| CN | 101567340 A | 10/2009 | | |
| JP | 2000-198831 A | 7/2000 | | |
| JP | A-2002-280329 | 9/2002 | | |
| JP | A-2004-260190 | 9/2004 | | |
| JP | 2007314634 A | * 12/2007 | ........... | C09D 183/00 |
| JP | 2008248122 A | * 10/2008 | ............. | C09J 171/10 |
| JP | 2009114295 A | * 5/2009 | ............. | C09J 163/02 |
| JP | 2010185013 A | * 8/2010 | ............. | C09J 171/10 |
| JP | A-2011-148946 | 8/2011 | | |

OTHER PUBLICATIONS

Machine translation of JP 2007314634 A, provided by the JPO website (no date).*
Machine translation of JP 2008248122 A, provided by the JPO website (no date).*
Machine translation of JP 2009114295 A, provided by the JPO website (no date).*
Machine translation of JP 2010185013 A, provided by the JPO website (no date).*
May 29, 2012 Notification of Reasons for Refusal issued in Japanese Patent Application No. 2010-057224 (with partial translation).
Jul. 1, 2013 Chinese Search Report for corresponding Chinese Application No. 2011-100650608 (with partial translation).

* cited by examiner

*Primary Examiner* — Michael J Feely
(74) *Attorney, Agent, or Firm* — Oliff & Berridge, PLC

(57) ABSTRACT

There is disclosed an adhesive composition containing: (A) 100 parts by mass of a phenoxy resin; (B) 5 to 200 parts by mass of an epoxy resin; (C) 1 to 20 parts by mass of an alkoxysilane-partial hydrolytic condensate which is a partial hydrolytic condensate of alkoxysilane including one kind or two or more kinds of alkoxysilane represented by the following general formulae (1) and (2)

$$Si(OR^3)_4 \quad (1)$$

$$R^1Si(OR^3)_3 \quad (2),$$

wherein the weight average molecular weight is 300 or more and 30,000 or less and an amount of residual alkoxy is 2 wt % or more and 50 wt % or less; (D) a curing catalyst for an epoxy resin; (E) an inorganic filler; and (F) a polar solvent having a boiling point of 80° C. to 180° C. and a surface tension of 20 to 30 dyne/cm at 25° C. There can be a sheet for forming a semiconductor wafer-protective film and an adhesive composition capable of forming a protective film excellent in evenness, cutting characteristics and adhesiveness.

12 Claims, No Drawings

ADHESIVE COMPOSITION AND SHEET FOR FORMING SEMICONDUCTOR WAFER-PROTECTIVE FILM

BACKGROUND OF THE INVENTION

1. Field of the Invention

The present invention relates to an adhesive composition and a sheet for forming a semiconductor wafer-protective film for forming a film to protect the back surface of a semiconductor wafer when dicing the semiconductor wafer.

2. Description of the Related Art

A flip-chip bonding method has been used so as to make a mounting area of a semiconductor chip small. Usually in this connection method, the following procedure is employed: (1) forming circuits and bonding bumps on the front surface of a semiconductor wafer, (2) polishing the back surface of the semiconductor wafer to a prescribed thickness, (3) dicing the semiconductor wafer to obtain a semiconductor chip, (4) connecting the chip to a substrate with arranging the circuit-formed surface of the chip to face the substrate and then (5) performing resin-molding or the like to protect the semiconductor chip.

However, fine streaky scratches are occasionally formed on the back surface of the semiconductor wafer in the polishing process (2) to cause crack generation after the dicing process and the packaging process. Accordingly, it has been proposed to form a protective film (a protective film for chips) on the back surface after the polishing process (2) so as not to adversely affect the subsequent processes even in the case that such damages are formed in the polishing process. Furthermore, a sheet for forming such a protective film, which is composed of a release sheet and a protective film-forming layer formed on the release-side surface of the release sheet, has been proposed (Japanese Patent Laid-Open (kokai) No. 2002-280329 and Japanese Patent Laid-Open (kokai) No. 2004-260190).

Meanwhile, in the dicing process, it has been known that a wafer is occasionally damaged due to vibration of a rotary blade (dicing blade) or the like (hereinafter referred to as "chipping").

It is also expected that the protective film for chips prevents chipping in the dicing process. However, when the protective film is not even, a gap is caused between a dicing film and the protective film, that is, a region where the dicing film does not contact the protective film is caused. Due to this unevenness of the protective film, there has been a problem that the nonuniform air layer between the protective film and the dicing film makes the rotary blade vibrate during cutting the wafer to further damage the wafer.

SUMMARY OF THE INVENTION

Accordingly, the present invention has an object to provide a sheet for forming a semiconductor wafer-protective film capable of forming a protective film excellent in evenness, cutting characteristics and adhesiveness and an adhesive composition capable of realizing a protective film-forming layer of the sheet for forming a semiconductor wafer-protective film to solve the above problems.

In order to solve the above problems, the present invention provides an adhesive composition containing at least:
(A) 100 parts by mass of a phenoxy resin;
(B) 5 to 200 parts by mass of an epoxy resin having at least two epoxy groups in the molecule;
(C) 1 to 20 parts by mass of an alkoxysilane-partial hydrolytic condensate which is a partial hydrolytic condensate synthesized by a hydrolytic condensation reaction of alkoxysilane including at least one kind or two or more kinds of alkoxysilane represented by the following general formulae (1) and (2), wherein the weight average molecular weight is 300 or more and 30,000 or less and an amount of residual alkoxy is 2 wt % or more and 50 wt % or less,

$$Si(OR^3)_4 \qquad (1)$$

$$R^1Si(OR^3)_3 \qquad (2)$$

wherein $R^3$ represents an alkyl group having 1 to 3 carbon atoms, and $R^1$ represents an alkyl group having 1 to 3 carbon atoms, a phenyl group, an oxetanyl group, a vinyl group, a hydroxyl group, an amino group, a (meth)acryloxy group, an isocyanate group or a γ-glycidoxy group, wherein each $R^1$ may be the same or different;
(D) an effective amount of a curing catalyst for an epoxy resin;
(E) 5 to 900 parts by mass relative to 100 parts by mass of the total amount of the above components (A), (B), (C) and (D) of an inorganic filler; and
(F) 10 to 300 parts by mass relative to 100 parts by mass of the total amount of the above components (A), (B), (C), (D) and (E) of a polar solvent having a boiling point of 80° C. to 180° C. and a surface tension of 20 to 30 dyne/cm at 25° C.

When such an adhesive composition is used, a protective film excellent in evenness, adhesiveness and cutting characteristics in being cut by a dicer can be formed.

Further, the alkoxysilane-partial hydrolytic condensate of the component (C) is preferably a partial hydrolytic condensate synthesized by a hydrolytic condensation reaction between one kind or two or more kinds of alkoxysilane represented by the foregoing general formulae (1) and (2) and alkoxysilane represented by the following general formula (3).

$$R^2{}_2Si(OR^3)_2 \qquad (3)$$

(In the formula, $R^3$ represents the same as above, and $R^2$ represents an alkyl group having 1 to 3 carbon atoms, a phenyl group, an oxetanyl group, a vinyl group, a hydroxyl group, an amino group, a (meth)acryloxy group, an isocyanate group or a γ-glycidoxy group, wherein each $R^2$ may be the same or different.)

The alkoxysilane-partial hydrolytic condensate of the component (C) is preferably a partial hydrolytic condensate synthesized by a hydrolytic condensation reaction between one kind or two or more kinds of the alkoxysilane represented by the foregoing general formulae (1) and (2) and the alkoxysilane represented by the foregoing general formula (3) (difunctional alkoxysilane) as described above, or especially a partial hydrolytic condensate having a trifunctional siloxane unit and a difunctional siloxane unit, because deterioration of adhesiveness by bleeding can be prevented.

Further, the alkoxysilane-partial hydrolytic condensate of the component (C) is preferably a partial hydrolytic condensate of one kind or two or more kinds of trialkoxysilane represented by the following general formula (4).

$$R^{1'}Si(OR^{3'})_3 \qquad (4)$$

(In the formula, $R^{3'}$ represents an alkyl group having 1 to 3 carbon atoms, and $R^{1'}$ represents an alkyl group having 1 to 3 carbon atoms, which is unsubstituted or substituted by an amino group, a (meth)acryloxy group, an isocyanate group or a γ-glycidoxy group.)

As described above, as a more preferable embodiment of the alkoxysilane-partial hydrolytic condensate, a partial hydrolytic condensate only of the trifunctional alkoxysilane is exemplified.

Further, the curing catalyst for an epoxy resin of the component (D) is preferably a phosphorus-based curing catalyst and/or an amine-based curing catalyst.

As described above, as the curing catalyst for an epoxy resin of the component (D), a phosphorus-based curing catalyst and an amine-based curing catalyst are exemplified.

Further, the present invention provides a sheet for forming a semiconductor wafer-protective film for forming a protective film on a semiconductor wafer comprising at least a base film and a protective film-forming layer composed of a composition obtained by removing the polar solvent of the component (F) by drying from the adhesive composition formed on one surface of the base film.

Such a sheet for forming a semiconductor wafer-protective film of the present invention enables to easily form a protective film excellent in evenness on the non-circuit surface of a semiconductor wafer. As a result, a gap between a dicing film and the protective film is scarcely caused, thereby enabling to prevent nonuniform vibration of a rotary blade in dicing from being caused. Therefore, chipping is scarcely caused and a reliable semiconductor device can be produced in a high yield.

The adhesive composition and the sheet for forming a semiconductor wafer-protective film of the present invention enable to form a protective film excellent in adhesiveness and especially evenness and excellent in cutting characteristics in being cut by a dicer.

DETAILED DESCRIPTION OF THE PREFERRED EMBODIMENTS

The present invention will be explained hereinafter in detail. In the present specification, "a weight average molecular weight" (occasionally abbreviated as Mw) means a weight average molecular weight in terms of polystyrene measured by a gel permeation chromatography.

As mentioned above, heretofore, a sheet for forming a semiconductor wafer-protective film capable of forming a protective film excellent in evenness, cutting characteristics and adhesiveness and an adhesive composition capable of realizing this sheet for forming a protective film have been required.

The inventor of the present invention found that an adhesive composition containing: (A) 100 parts by mass of a phenoxy resin; (B) 5 to 200 parts by mass of an epoxy resin having at least two epoxy groups in the molecule; (C) 1 to 20 parts by mass of an alkoxysilane-partial hydrolytic condensate which is a partial hydrolytic condensate synthesized by a hydrolytic condensation reaction of alkoxysilane including at least one kind or two or more kinds of alkoxysilane represented by the following general formulae (1) and (2), wherein the weight average molecular weight is 300 or more and 30,000 or less and an amount of residual alkoxy is 2 wt % or more and 50 wt % or less,

  (1)

  (2)

(wherein $R^3$ represents an alkyl group having 1 to 3 carbon atoms, and $R^1$ represents an alkyl group having 1 to 3 carbon atoms, a phenyl group, an oxetanyl group, a vinyl group, a hydroxyl group, an amino group, a (meth)acryloxy group, an isocyanate group or a γ-glycidoxy group, wherein each $R^1$ may be the same or different); (D) an effective amount of a curing catalyst for an epoxy resin; (E) 5 to 900 parts by mass relative to 100 parts by mass of the total amount of the above components (A), (B), (C) and (D) of an inorganic filler; and (F) 10 to 300 parts by mass relative to 100 parts by mass of the total amount of the above components (A), (B), (C), (D) and (E) of a polar solvent having a boiling point of 80° C. to 180° C. and a surface tension of 20 to 30 dyne/cm at 25° C. enables to form a protective film excellent in evenness, cutting characteristics and adhesiveness.

Hereinafter, the adhesive composition of the present invention will be described.

<Adhesive Composition>

-(A) Phenoxy Resin-

A weight average molecular weight of the phenoxy resin is usually 10,000 to 200,000, and preferably 12,000 to 100,000.

As the phenoxy resin, a bisphenol-based epoxy resin derived from epichlorohydrin and bisphenol A or F is enumerated, for example. Examples of such a phenoxy resin include PKHC, PKHH and PKHJ (trade names, all manufactured by Tomoe Engineering Co., Ltd.), Epicoat 4250, Epicoat 4275 and Epicoat 1255HX30 (trade names, bisphenol. A and bisphenol F-mixed type resins, all manufactured by Nippon Kayaku Co., Ltd.) and Epicoat 5580BPX40 (trade name, using brominated epoxy, manufactured by Nippon Kayaku Co., Ltd.), YP-50, YP-50S, YP-55 and YP-70 (trade names, bisphenol. A-type, all manufactured by Tohto Kasei Co., Ltd.), JER E1256, E4250, E4275, YX6954BH30 and YL7290BH30 (trade names, bisphenol A-type, all manufactured by Japan Epoxy Resins Co., Ltd.) and the like.

A bisphenol A-type such as PKHH, YP-50, YP-50S, YP-55, Y2-70 and JER E1256 is preferable as the phenoxy resin.

Any one kind of these phenoxy resins may be used solely and any two or more kinds of them may be used in combination.

-(B) Epoxy Resin-

The epoxy resin used as the component (B) of the present invention is a composition having at least two epoxy groups in the molecule. In particular, its weight per epoxy equivalent is preferably 50 to 5,000 g/eq and more preferably 100 to 500 g/eq.

A weight average molecular weight of the epoxy resin is usually less than 10,000, preferably 400 to 9,000 and more preferably 500 to 8,000.

Examples of such an epoxy resin include diglycidyl ether of bis(4-hydroxyphenyl)methane, 2,2'-bis(4-hydroxyphenyl) propane or these halide; condensation polymer of them (so-called a bisphenol F-type epoxy resin, a bisphenol A-type epoxy resin and the like); butadiene diepoxide; vinylcyclohexene dioxide; diglycidyl ether of resorcine; 1,4-bis(2,3-epoxypropoxy)benzene; 4,4'-bis(2,3-epoxypropoxy) diphenylether; 1,4-bis(2,3-epoxypropoxy)cyclohexene; bis(3,4-epoxy-6-methylcyclohexylmethyl) adipate; epoxy glycidyl ether or polyglycidyl ester obtained by condensation of a multivalent phenol or a multivalent alcohol such as 1,2-dihydroxybenzene and resorcinol with epichlorohydrin; an epoxy novolac obtained by condensation of a novolac-based phenol resin (or a halogenated novolac-based phenol resin) such as phenol novolac and cresol novolac with epichlorohydrin (that is, a novolac-based epoxy resin); an epoxidized polyolefin or epoxidized polybutadiene which is epoxidized by overoxidation method; a naphthalene ring-containing epoxy resin; a biphenyl-based epoxy resin; a phenolaralkyl-based epoxy resin; biphenylaralkyl-based epoxy resin; and cyclopentadiene-based epoxy resin.

Among them, a bisphenol F-type epoxy resin and a bisphenol A-type epoxy resin, which are liquid at room temperature, are preferable as the component (B).

Any one kind of these epoxy resins may be used solely and any two or more kinds of them may be used in combination.

A blending amount of the epoxy resin of the component (B) is 5 to 200 parts by mass and especially preferably 10 to 100 parts by mass relative to 100 parts by mass of the phenoxy resin of the component (A). When the blending amount of the epoxy resin is less than 5 parts by mass, adhesive force of the adhesive composition is occasionally deteriorated, and when the blending amount is more than 200 parts by mass, flexibility of an adhesive composition layer is occasionally deficient.

-(C) Alkoxysilane-Partial Hydrolytic Condensate-

The component (C) is a partial hydrolytic condensate synthesized by a hydrolytic condensation reaction of alkoxysilane including at least one kind or two or more kinds of alkoxysilane represented by the following general formulae (1) and (2), wherein the weight average molecular weight is 300 or more and 30,000 or less and an amount of residual alkoxy is 2 wt % or more and 50 wt % or less.

$$Si(OR^3)_4 \quad (1)$$

$$R^1Si(OR^3)_3 \quad (2)$$

(In the formula, $R^3$ represents an alkyl group having 1 to 3 carbon atoms, and $R^1$ represents an alkyl group having 1 to 3 carbon atoms, a phenyl group, an oxetanyl group, a vinyl group, a hydroxyl group, an amino group, a (meth)acryloxy group, an isocyanate group or a γ-glycidoxy group, wherein each $R^1$ may be the same or different.)

Further, the alkoxysilane-partial hydrolytic condensate as the component (C) may also be a partial hydrolytic condensate synthesized by a hydrolytic condensation reaction between one kind or two or more kinds of the alkoxysilane represented by the foregoing general formulae (1) and (2) and alkoxysilane represented by the following general formula (3).

$$R^2{}_2Si(OR^3)_2 \quad (3)$$

(In the formula, $R^3$ represents the same as above, and $R^2$ represents an alkyl group having 1 to 3 carbon atoms, a phenyl group, an oxetanyl group, a vinyl group, a hydroxyl group, an amino group, a (meth)acryloxy group, an isocyanate group or a γ-glycidoxy group, wherein each $R^2$ may be the same or different.)

A silicone oil is composed of a difunctional siloxane. On the other hand, the partial hydrolytic condensate synthesized by a hydrolytic condensation reaction of the alkoxysilane including one kind or two or more kinds of the alkoxysilane represented by the general formulae (1) and (2) is a silicone having a three-dimensional network structure mainly composed of a trifunctional or tetrafunctional siloxane unit, which also includes a partial hydrolytic condensate synthesized by a hydrolytic condensation reaction of the alkoxysilane including one kind or two or more kinds of the alkoxysilane represented by the general formulae (1) and (2) and a further hydrolytic condensation reaction, in addition to a partial hydrolytic condensate directly synthesized by a hydrolytic condensation reaction of the alkoxysilane including one kind or two or more kinds of the alkoxysilane represented by the general formulae (1) and (2). The structure of the alkoxysilane-partial hydrolytic condensate as the component (C) is not particularly limited as far as it has a tetrafunctional or trifunctional siloxane unit, and examples thereof include 1) one in which a difunctional siloxane unit and further a tetrafunctional and/or trifunctional siloxane unit are used in combination, 2) one composed of a tetrafunctional and/or trifunctional siloxane unit only, and the like. In view of prevention of deterioration of adhesiveness by bleeding, the alkoxysilane-partial hydrolytic condensate preferably has at least a trifunctional siloxane unit and a difunctional siloxane unit, and it is more preferable that difunctional siloxane unit/trifunctional siloxane unit (mole ratio) exceeds 1.

In the general formulae (2) and (3), each $R^1$ and $R^2$ bonded to a silicon atom is an alkyl group having 1 to 3 carbon atoms, a phenyl group, an oxetanyl group, a vinyl group, a hydroxyl group, an amino group, a (meth)acryloxy group, an isocyanate group or a γ-glycidoxy group. Among them, alkoxysilane having a phenyl group and a methyl group is preferable in view of a property of being coated smoothly to a base film and compatibility with a thermoplastic resin or a thermosetting resin. In addition, in view of increasing a crosslinking density, $R^1$ and $R^2$ having an amino group, a (meth)acryloxy group, an isocyanate group or a γ-glycidoxy group is preferable. The crosslinking density is increased by using such a group, thereby enabling to obtain an adhesive composition excellent in heat resistance, reflow resistance, film strength and solvent resistance. In trifunctional siloxane units of the alkoxysilane-partial hydrolytic condensate (organopolysiloxane), there may be a single kind or two or more kinds of $R^1$. $R^1$ further preferably has a phenyl group and a methyl group, because all of heat resistance, compatibility with a thermoplastic resin or a thermosetting resin and a high crosslinking density can be satisfied.

Further, a partial hydrolytic condensate only of a trifunctional alkoxysilane is more preferable, the alkoxysilane-partial hydrolytic condensate as the component (C) is preferably a partial hydrolytic condensate of one kind or two or more kinds of trialkoxysilane represented by the following general formula (4).

$$R^{1\prime}Si(OR^{3\prime})_3 \quad (4)$$

(In the formula, $R^{3\prime}$ represents an alkyl group having 1 to 3 carbon atoms, and $R^{1\prime}$ represents an alkyl group having 1 to 3 carbon atoms, which is unsubstituted or substituted by an amino group, a (meth)acryloxy group, an isocyanate group or a γ-glycidoxy group.)

Further, all bonds of the main chain of a partial hydrolytic condensate of alkoxysilane including the trifunctional alkoxysilane represented by the general formula (2) are preferably siloxane bonds. By containing such an alkoxysilane-partial hydrolytic condensate, the property of being coated smoothly to a base film of the adhesive composition can be improved.

Examples of a partial hydrolytic condensate of alkoxysilane including the tetrafunctional alkoxysilane represented by the general formula (1) include: a partial hydrolytic condensate of tetramethoxysilane, tetraethoxysilane, tetraisopropoxysilane or tetramethoxysilane (trade name of "M-silicate 51", manufactured by Tama Chemicals Co., Ltd., trade name of "MSI51", manufactured by Colcoat Co., Ltd. and trade names of "MS51" and "MS56", manufactured by Mitsubishi Chemical Corporation, respectively); a partial hydrolytic condensate of tetraethoxysilane (trade names of "silicate35" and "silicate45", manufactured by Tama Chemicals Co., Ltd. and trade names of "ESI40" and "ESI48", manufactured by Colcoat Co., Ltd.); and a co-partial hydrolysis condensate of tetramethoxysilane and tetraethoxysilane (trade name of "FR-3", manufactured by Tama Chemicals Co., Ltd. and trade name of "EMSi48", manufactured by Colcoat Co., Ltd.) and the like.

Examples of a partial hydrolytic condensate of alkoxysilane including the trifunctional alkoxysilane represented by the general formula (2) include: (i) SY231 (including a methoxy group, a phenyl group and methyl group (alkoxy equivalent: 222)), SY550 (including a methoxy group, a phenyl group and a methyl group), SY300 (including a hydroxyl group, a phenyl group and a propyl group (hydroxyl value: 3 wt %)), SY409 (including a hydroxyl group, a phenyl group and a methyl group (hydroxyl value: 2.5 wt %)), SY430 (including a hydroxyl group and a phenyl group (hydroxyl value: 5 wt %)) and IC836 (including a hydroxyl group and a phenyl group (hydroxyl value: 3.5 wt %)) (all manufactured by Wacker Asahikasei Silicone Co., Ltd.);

(ii) a straight silicone resin: KR220L (solid), KR242A, KR271, KR282 (weight average molecular weight (Mw)=100,000 to 200,000, including a hydroxyl group (hydroxyl value: 1 wt %)), KR300 and KR311 (Mw=6,000 to 10000, including a hydroxyl group (hydroxyl value: 4.5 wt %)), and a silicone intermediate: KC89 (including a methoxy group and a methyl group (methoxy group content: 45 wt %)), KR500 (including a methoxy group (methoxy group content: 30 wt %)), KR212 (Mw=2,000 to 3,000, including a hydroxyl group, a methyl group and a phenyl group (hydroxyl value: 5 wt %)), KR213 (including a methoxy group, a methyl group and a phenyl group, (methoxy group content: 22 wt %)), KR9218 (including a methoxy group, a methyl group and a phenyl group, (methoxy group content: 15 wt %)), KR251, KR400, KR255, KR216 and KR152, (all manufactured by Shin-Etsu Chemical Co., Ltd.);

(iii) a silicone resin: 804RESIN (phenylmethyl-based), 805RESIN (phenylmethyl-based), 806ARESIN (phenylmethyl-based), 840RESIN (phenylmethyl-based) and SR2400 (methyl-based), a silicone intermediate: 3037INTERMEDIATE (Mw=1,000, including a methoxy group, a phenyl group and a methyl group (methoxy group content: 18 wt %)), 3074INTERMEDIATE (Mw=1,400, including a methoxy group, a phenyl group and a methyl group (methoxy group content: 17 wt %)), Z-6018 (Mw=2,000, including a hydroxyl group, a phenyl group and a propyl group (hydroxyl value: 6 wt %)), 217FLAKE (Mw-2,000, including a hydroxyl group and a phenyl group (hydroxyl value: 6 wt %)), 220FLAKE (Mw=3,000, including a hydroxyl group, a phenyl group and a methyl group (hydroxyl value: 6 wt %)), 233FLAKE (Mw=3,000, including a hydroxyl group, a phenyl group and a methyl group (hydroxyl value: 6 wt %)), 249FLAKE (Mw=3,000, including a hydroxyl group, a phenyl group and a methyl group (hydroxyl value: 6 wt %)), QP8-5314 (Mw=200, including a methoxy group, a phenyl group and a methyl group (methoxy group content: 42 wt %)), SR2402 (Mw=1,500, including a methoxy group and a methyl group (methoxy group content: 31 wt %)), AY42-161 (Mw=1,500, including a methoxy group and a methyl group (methoxy group content: 36 wt %)), AY42-162 (Mw=2,500, including a methoxy group and a methyl group (methoxy group content: 33 wt %)) and AY42-163 (Mw=4,500, including a methoxy group and a methyl group (methoxy group content: 25 wt %)) (all manufactured by Dow Corning Toray Co., Ltd.); and (iv) a silsesquioxane derivative: OX-SQ (including an oxetanyl group (functional group equivalent: 263 g/eq)), OX-SQ-H (including an oxetanyl group (functional group equivalent: 283 g/eq)), OX-SQSI-20 (including an oxetanyl group (functional group equivalent: 262 g/eq)) and AC-SQ (including an acryloyl group (functional group equivalent: 165 g/eq)) (all manufactured by Toagosei Co., Ltd.), and an alkoxysilane-partial hydrolytic condensate in which a further hydrolytic condensation reaction is conducted to these alkoxysilane-partial hydrolytic condensate.

Examples of a partial hydrolytic condensate of alkoxysilane including the difunctional alkoxysilane represented by the general formula (3) include: a partial hydrolytic condensate using methylhydrogendimethoxysilane, methylhydrogendiethoxysilane, dimethyldimethoxysilane, dimethyldiethoxysilane, methylethyldimethoxysilane, diethyldimethoxysilane, diethyldiethoxysilane, methylpropyldimethoxysilane, methylpropyldiethoxysilane, diisopropyldimethoxysilane, phenylmethyldimethoxysilane, vinylmethyldimethoxysilane, γ-glycidoxypropylmethyldimethoxysilane, γ-glycidoxypropylmethyldiethoxysilane, β-(3,4-epoxycyclohexyl)ethylmethyldimethoxysilane, γ-metacryloxypropylmethyldimethoxysilane, γ-metametacryloxypropylmethyldiethoxysilane, γ-mercaptopropylmethyldimethoxysilane, γ-aminopropylmethyldiethoxysilane, N-(2-aminoethyl)aminopropylmethyldimethoxysilane and the like.

A blending amount of the alkoxysilane-partial hydrolytic condensate is 1 to 20 parts by mass relative to 100 parts by mass of the phenoxy resin of the component (A) and preferably 2 to 15 parts by mass. When the blending amount is less than 1 part by mass, evenness of a protective film, which is necessary for preventing the chipping, is hardly obtained in the case of being laminated on a semiconductor wafer. When it is more than 20 parts by mass, deterioration of adhesive force of the adhesive composition of the present invention and deterioration of evenness of a protective film are easily caused and moreover, phase separation of the composition (coating solution) is easily caused.

-(D) Curing Catalyst for Epoxy Resin-

As the curing catalyst for an epoxy resin of the component (D), a phosphorus-based curing catalyst, an amine-based curing catalyst and the like are exemplified.

Examples of the phosphorus-based curing catalyst include triphenylphosphine, triphenylphosphonium triphenyl borate, tetraphenylphosphonium tetraphenyl borate and a compound represented by the following formula.

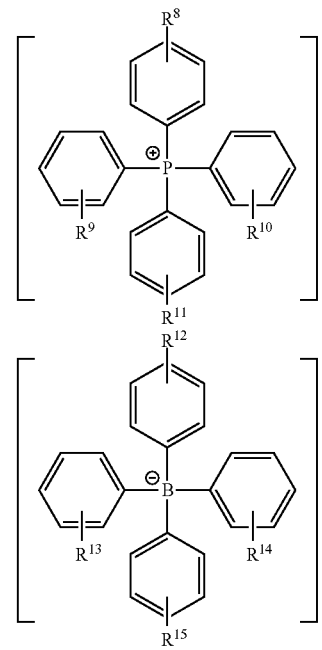

(In the formula, each $R^8$ to $R^{15}$ independently represents a hydrogen atom; a halogen atom such as fluorine, bromine and iodine; a monovalent unsubstituted hydrocarbon group such as an alkyl group having 1 to 8 carbon atoms such as a methyl group, an ethyl group, a propyl group and a butyl group; an alkenyl group having 2 to 8 carbon atoms such as a vinyl group and an allyl group, an alkynyl group having 2 to 8 carbon atoms such as a propynyl group and a butenyl group, an aryl group having 6 to 8 carbon atoms such as a phenyl group and a toluoyl group; a group in which at least a part of hydrogen atoms of these hydrocarbon groups is substituted by a halogen atom such as fluorine, bromine and iodine (substituted hydrocarbon group such as a trifluoromethyl group); and an alkoxy group having 1 to 8 such as a methoxy group, an ethoxy group, a propoxy group and butoxy group. In the substituted monovalent hydrocarbon group, all substitutes may be the same or different with each other.)

Especially preferable examples of the phosphorus-based curing catalyst include triphenylphosphine, triphenylphosphonium triphenyl borate, tetraphenylphosphonium tetraphenyl borate and the like.

Examples of the amine-based curing catalyst include dicyandiamide, an imidazole derivative such as 2-methylimidazole, 2-ethyl-4-methylimidazole, 1-cyanoethyl-2-methylimidazole and 2-phenyl-4,5-dihydroxymethylimidazole and the like. Among them, dicyandiamide and 2-phenyl-4,5-dihydroxymethylimidazole are preferable.

As the catalyst of the component (D), one of the above-mentioned catalysts may be used solely and a mixture of any two or more kinds of them may be used. Dicyandiamide is especially preferably used.

A blending amount of the curing catalyst for an epoxy resin of the component (D) is an effective amount, and specifically 5 to 50 parts by mass.

-(E) Inorganic Filler-

As the inorganic filler (E) used in the present invention, silica, a metal oxide such as alumina and titanium oxide, and an electroconductive particle such as a carbon black particle and a silver particle may be used. As silica, fused silica and crystalline silica are preferable. Among them, silica, a metal oxide such as alumina and titanium oxide are especially preferable.

An average particle size of the inorganic filler is preferably 0.1 to 10 μm, and more preferably 0.5 to 7 μm. When the average particle size of the inorganic filler is in this range, it is easy to keep the surface of the film in good condition not only as the protective film-forming layer of the sheet for forming a protective film but also as a protective film formed on a semiconductor wafer and thereby a uniform film is easily obtained. In addition, a thickness of a film recently required for an adhesive composition layer is 15 to 50 μm, and when the average particle size of the inorganic filler is in this range, intended thickness can be obtained without any trouble even in the presence of a secondary particle (aggregated particles).

A blending amount of the inorganic filler is 5 to 900 parts by mass, more preferably 10 to 700 parts by mass, and most preferably 100 to 500 parts by mass relative to 100 parts by mass of the total amount of the components (A), (B), (C) and (D). When the blending amount is less than 5 parts by mass, it is difficult to sufficiently accomplish the aim of blending the inorganic filler to result in higher water absorption, higher linear expansion coefficient and lower strength. When the blending ratio is more than 900 parts by mass, viscosity of the composition increases to result in worse handling properties.

-(F) Solvent-

As the solvent of the component (F), a polar solvent having a boiling point of 80° C. to 180° C. and a surface tension of 20 to 30 dyne/cm at 25° C. is used.

A boiling point of the solvent is preferably 100° C. to 180° C. and more preferably 120° C. to 160° C. In the case of the boiling point of less than 80° C., the solvent is stripped from the coating solution (composition) during coating to cause gelatinous substances in the coating solution, thereby it becomes difficult to form an even coating film. In the case of the boiling point of more than 180° C., high temperature treatment is necessary for removing the solvent from the coating film after coating, so that a reaction in the composition proceeds to cause decrease in function as a adhesive film.

A surface tension at 25° C. of the polar solvent is 20 to 30 dyne/cm ($2\times10^{-4}$ to $3\times10^{-4}$ N/cm). In the case of the surface tension of less than 20 dyne/cm, it becomes difficult to maintain the edge portion profile of the coating film when it is coated and furthermore to maintain the edge profile of the film after being dried, and a longitudinal streak is easily caused. In the case of the surface tension of more than 30 dyne/cm, coatability to a base film decreased, so that an uncoated portion is easily caused.

Preferable examples of the polar solvent of the component (F) include an aromatic hydrocarbon-based solvent such as xylene, ethylbenzene, n-propylbenzene, isopropylbenzene and styrene; a perfluoroaromatic hydrocarbon-based solvent such as perfluorobenzene and perfluorotoluene; a halogenated hydrocarbon-based solvent such as tetrachloromethane, ethyl chloride, 1,1,1-trichloroethane, isobutyl chloride, t-butyl chloride, vinyl chloride and bromoethyl; an ether-based solvent such as diethyl ether and diisopropyl ether; a ketone-based solvent such as methyl ethyl ketone, dibutyl ketone, methyl n-propyl ketone, methyl isobutyl ketone, methyl n-butyl ketone, methyl isoamyl ketone, methyl hexyl ketone, diisopropyl ketone and diisobutyl ketone; an alkyl acetate-based solvent such as n-propyl acetate, isopropyl acetate, n-butyl acetate and butyl acetate; and cyclohexanone etc. Among them, methyl ethyl ketone, cyclohexanone, methyl isobutyl ketone and a mixture thereof are preferable.

Any one kind of these polar solvents may be used solely and any two or more kinds of them may be used in combination, and it is preferable that two or more kinds of them are used in combination. By using two or more kinds, and especially two kinds, in combination to cause differences in a boiling point and in a solubility of the composition, and thereby an even coating film can be formed. When two or more kinds are used, an amount of each solvent is preferably 25 wt % at least.

Further, a blending amount of the polar solvent is 10 to 300 parts by mass relative to 100 parts by mass of the total amount of the components (A), (B), (C), (D) and (E).

-Other Arbitrary Components-

The adhesive composition of the present invention may contain other components and various additives as appropriate in addition to the components described above. Other arbitrary components will be explained below.

Monoepoxy Composition

In addition to the epoxy resin of the component (B) (having at least two epoxy groups in the molecule) described above, the amount not diminishing the object of the present invention of a monoepoxy composition may be blended. Examples of the monoepoxy composition include styrene oxide, cyclohexene oxide, propylene oxide, methyl glycidyl ether, ethyl glycidyl ether, phenyl glycidyl ether, allyl glycidyl ether, octylene oxide, dodecene oxide and the like.

Curing Agent for Epoxy Resin

A curing agent is not an essential component. However, a resin matrix can be controlled by adding this, and effects such as lower linear expansion coefficient, higher Tg and lower elastic modulus can be expected.

As the curing agent, any known curing agent for an epoxy resin can be used. Examples of the curing agent include: amine compounds such as diethylenetriamine, triethylenetetramine, diethylaminopropylamine, N-aminoethylpiperazine, bis(4-amino-3-methylcyclohexyl)methane, metaxylylenediamine, menthanediamine, and 3,9-bis(3-aminopropyl)-2,4,8,10-tetraoxaspiro[5.5]undecane; modified aliphatic polyamines such as epoxy resin-diethylenetriamine adduct, amine-ethylene oxide adduct and cyanoethylated polyamine; phenolic resins having at least two phenolic hydroxyl groups in the molecule, such as bisphenol A, trimethylol allyloxyphenol, phenol novolac resins having a low degree of polymerization, epoxidized or butylated phenolic resins, and phenolic resins available under the trade names of "Super Beckcite 1001" (manufactured by Japan Reichhold Chemical Co., Ltd.), "Hitanol 4010" (manufactured by Hitachi Ltd.), "Scado form L. 9" (manufactured by Scado Zwoll, Netherlands), and "Methylon 75108" (manufactured by General Electric Company); carbon resins available under the trade names of "Beckamine P. 138" (manufactured by Japan Reichhold Chemical Co., Ltd.), "Melan" (manufactured by Hitachi Ltd.), and "U-Van 10R" (manufactured by Toyo Koatsu Kogyo Co., Ltd.); amino resins such as melamine resins and aniline resins; polysulfide resins having at least two mercapto groups in the molecule represented by the formula: $HS(C_2H_4OCH_2OC_2H_4SS)_nC_2H_4OCH_2-OC_2H_4SH$ (in the formula, n is an integer of 1 to 10); and organic acids and acid anhydrides thereof such as phthalic anhydride, hexahydrophthalic anhydride, tetrahydrophthalic anhydride, pyromellitic anhydride, methylnadic acid, dodecylsuccinic anhydride, and chlorendic anhydride and the like.

Among the curing agents described above, phenolic-type resins (especially, phenol novolac resins) are desired because they provide good molding property and humidity resistance to the composition of the present invention as well as they are non-toxic and relatively less costly.

Any one kind of the curing agents described above may be used solely and any two or more kinds of them may be used in combination depending on curing performance and the like.

An amount of the curing agent is appropriately adjusted in the range not disturbing the reaction between the phenoxy resin of the component (A) and the epoxy resin of the component (B) depending on their types. Generally, the amount of the curing agent to be used ranges from 1 to 100 parts by mass and preferably from 5 to 50 parts by mass, relative to 100 parts by mass of the epoxy resin. When the amount of the curing agent is 1 part by mass or more, an effect of adding the curing agent can usually be expected, and when the amount of the curing agent is 100 parts by or less, there is no possibility of high production costs, and longer time for curing due to dilution of the epoxy resin is not necessary, or moreover, a drawback of a decrease in properties of a cured product is not caused.

-Other Additives-

In the adhesive composition of the present invention, colorants such as inorganic or organic pigments and dyes, silane coupling agents, antioxidants, flame retardants, antistatic agents, heat stabilizers and the like may be added. When a protective film is colored by blending additives such as pigments and dyes, for example, in the case of impression such as laser marking, visibility and performance to be recognized by optical instruments are improved.

Further, the present invention provides a sheet for forming a semiconductor wafer-protective film for forming a protective film on a semiconductor wafer comprising at least a base film and a protective film-forming layer composed of a composition obtained by removing the polar solvent of the component (F) by drying from the above-mentioned adhesive composition formed on one surface of the base film. The sheet for forming a semiconductor wafer-protective film will be explained below.

<Sheet for Forming Semiconductor Wafer-Protective Film>
-Base Film-

As the base film, a synthetic resin film such as a polyethylene film, a polypropylene film, a polyvinyl chloride film, a polyethylene terephthalate film and a polyimide film is used. Especially in the case of delaminating the base film from a protective film-forming layer after curing the protective film-forming layer which prevents chipping, a polyethylene terephthalate film or a polyimide film which are excellent in heat resistance is preferably used. In addition, the surface of the base film may be subjected to a release treatment, which is coating a silicone resin, a fluorocarbon resin or the like, to form a releasable film.

A film thickness of the base film is generally about 5 to 200 μm, preferably about 10 to 150 μm, and more preferably about 20 to 100 μm.

-Protective Film-Forming Layer-

The composition of the present invention described above is applied on the base film to have a thickness of 5 to 100 μm generally, and preferably 10 to 60 μm after drying the solvent by a known method such as gravure coater, thereby the protective film-forming layer can be obtained.

A drying condition of the solvent in the above composition is generally about 2 hours or more at room temperature or about 1 to 20 minutes at 40 to 130° C., and preferably 1 to 20 minutes at 50 to 120° C.

The sheet for forming a semiconductor wafer-protective film of the present invention can be used by the method including the following steps:
(1) a step of laminating the back surface of a circuit-formed semiconductor wafer on the protective film-forming layer of the sheet for forming a protective film of the present invention,
(2) a step of delaminating the base film from the protective film-forming layer to obtain the semiconductor wafer having the protective film on the back surface thereof,
(3) a step of curing the protective film by heating,
(4) a step of laminating a dicing film on the cured protective film, and
(5) a step of dicing the semiconductor wafer and the protective layer.

Here, the steps (2) and (3) may be in reverse order.

Heating of the step (3) is for that a curing agent exerts its curing performance effectively, and the heating condition is generally 30 minutes to 12 hours at 120 to 200° C., and especially preferably 1 to 6 hours at 150 to 190° C.

Dicing of a semiconductor wafer of the step (5) is performed by using a dicing sheet in a usual manner. By using the sheet for forming a protective film of the present invention, tiny cracks or chipping are scarcely produced on the cut surface of the chip. By the dicing, a semiconductor chip having a protective film on the back surface can be obtained. This chip is picked up by a general-purpose device such as collet. Thus, a highly uniform protective film can be readily formed on the back surface of the chip and chipping caused by dicing can be reduced, so that a semiconductor device with fewer damages on the circuit surface can be produced in a high yield.

EXAMPLES

Hereinafter, the present invention will be explained specifically by Synthesis Examples, Comparative Synthesis Examples, Examples and Comparative Examples, but the present invention is not limited to the Examples described below.

<Manufacturing of Alkoxysilane-Partial Hydrolytic Condensate>

Synthesis Example 1

Into a 2 L flask were added 400 g of methyltriethoxysilane (2.25 Si moles), 91 g of tetramethoxysilane (0.60 Si mole) and 37 g of γ-glycidoxypropylmethyldiethoxysilane (0.15 Si mole), and mixed them well. Then, after the mixture solution was cooled down to the temperature of about 10° C., 306 g of 0.25N acetic acid aqueous solution was dropped thereinto and hydrolysis was conducted with cooling the mixture solution to keep the temperature thereof 40° C. or less. After the dropping was finished, the mixture solution was stirred for 1 hour at 40° C. or less and then for 3 hours at 60° C., and thereby completing the hydrolysis.

Thereafter, methanol and ethanol generated by the hydrolysis were removed under normal pressure until the solution temperature reached 80° C., and then a transparent and colorless alkoxysilane-partial hydrolytic condensate A (alkoxysilane-partial hydrolytic condensate A) was obtained.

Synthesis Example 2

Into a 2 L flask were added 232 g of KC-89S (trade name, manufactured by Shin-Etsu Chemical Co., Ltd., partial hydrolytic condensate of methyltrimethoxysilane, average 4 monomer unit oligomer) (2.29 Si moles), and 240 g of methanol, and mixed them well. Then, after the mixture solution was cooled down to the temperature of about 10° C., 245 g of 0.05N hydrochloric acid aqueous solution was dropped thereinto and hydrolysis was conducted with cooling the mixture solution to keep the temperature thereof 40° C. or less. After the dropping was finished, the mixture solution was stirred for 6 hours at 60° C., and thereby completing the hydrolysis.

Thereafter, methanol generated by the hydrolysis was removed under reduced pressure of 80 mmHg for 1 hour at the solution temperature of 50° C. or less, and then a transparent and colorless alkoxysilane-partial hydrolytic condensate solution B (alkoxysilane-partial hydrolytic condensate B) was obtained.

Comparative Synthesis Example 1

Into a 2 L flask were added 240 g of methyltriethoxysilane (1.35 Si moles), and 343 g of tetraethoxysilane (1.65 Si moles) and mixed them well. Then, after the mixture solution was cooled down to the temperature of about 10° C., 345 g of 0.25N acetic acid aqueous solution was dropped thereinto and hydrolysis was conducted with cooling the mixture solution to keep the temperature thereof 40° C. or less. After the dropping was finished, the mixture solution was stirred for 3 hour at 60° C., and thereby completing the hydrolysis.

Thereafter, ethanol generated by the hydrolysis was removed under normal pressure until the solution temperature reached 80° C., and then a transparent and colorless alkoxysilane-partial hydrolytic condensate solution C (alkoxysilane-partial hydrolytic condensate C) was obtained. Here, a weight average molecular weight of the alkoxysilane-partial hydrolytic condensate C was 36,000, and this value was not within the range of the weight average molecular weight of the alkoxysilane-partial hydrolytic condensate in the adhesive composition of the present invention (300 or more and 30,000 or less).

Comparative Synthesis Example 2

Into a 2 L flask were added 600 g of methyltrimethoxysilane (4.41 Si moles), 0.4 g of acetic acid and 80 g of distilled water. Then, after the mixture solution was cooled down to the temperature of 10° C. or less, hydrolysis was conducted for 3 hours at the temperature of 10° C. or less. The mixture solution was stirred for 16 hours at room temperature and then 4 hours at 60° C., and thereby completing the hydrolysis.

Thereafter, methanol generated by the hydrolysis was removed under reduced pressure of 80 mmHg for 1 hour at the solution temperature of 50° C. or less, and then a transparent and colorless alkoxysilane-partial hydrolytic condensate solution D (alkoxysilane-partial hydrolytic condensate D) was obtained. Here, a weight average molecular weight of the alkoxysilane-partial hydrolytic condensate D was 200, and this value was not within the range of the weight average molecular weight of the alkoxysilane-partial hydrolytic condensate in the adhesive composition of the present invention (300 or more and 30,000 or less).

The results of a gel permeation chromatography (GPC) analysis (in terms of polystyrene) of the obtained alkoxysilane-partial hydrolytic condensates are shown in Table 1.

TABLE 1

| | | $SiO_{(4-o)/2}(OX)_o$ unit (mole %) | $R^1SiO_{(3-p)/2}(OX)_p$ unit (mole %) | $(R^2)_2SiO_{(2-q)/2}(OX)_q$ unit (mole %) | Weight average molecular weight (Mw) | Amount of residual alkoxy (Wt %) |
|---|---|---|---|---|---|---|
| Synthesis Example 1 | Alkoxysilane-partial hydrolytic condensate A | 20 | 75 | 5 | 11,000 | 25 |
| Synthesis Example 2 | Alkoxysilane-partial hydrolytic condensate B | 0 | 100 | 0 | 2,000 | 25 |
| Comparative Synthesis Example 1 | Alkoxysilane-partial hydrolytic condensate C | 55 | 45 | 0 | 36,000 | 30 |
| Comparative Synthesis Example 2 | Alkoxysilane-partial hydrolytic condensate D | 0 | 100 | 0 | 200 | 30 |

(Preparation of Adhesive Composition)

Amounts shown in Table 2 and Table 3 of the following components were mixed to obtain a composition having a solid content of 50 wt %. The components (A) to (E) shown in Table 2 and Table 3 are as follows.

Component (A)
A phenoxy resin-based polymer: JER1256 (manufactured by Japan Epoxy Resins Co., Ltd.), Mw of 60,000

Component (B)
An epoxy resin: RE310S (manufactured by Nippon Kayaku Co., Ltd.), viscosity at 25° C. of 15 Pa·s Component (C)
Alkoxysilane-partial hydrolytic condensate A, alkoxysilane-partial hydrolytic condensate B, alkoxysilane-partial hydrolytic condensate C and alkoxysilane-partial hydrolytic condensate D described above Component (D)
Dicyandiamide (DICY-7): manufactured by Japan Epoxy Resins Co., Ltd.

Component (E)
Silica: SE2050, average particle size of 0.5 μm, maximum particle size of 5 μm, treated with KBM-403, produced by Adamatechs Co., LTD.

Component (F)
Cyclohexanone, methyl isobutyl ketone and methyl ethyl ketone (Production of Sheet for Forming Protective Film)

The adhesive composition prepared as described above was applied on a 38 μm-thick PET film whose surface was coated with a silicone release agent and dried by heating at 110° C. for 10 minutes to remove the solvent, to form a 25 μm-thick protective film-forming layer.

(Sensory Evaluation of Appearance)

Each protective film-forming layer was visually observed and confirmed whether there is coating unevenness or not in the protective film-forming layer by using transmitted light.

(Evenness Test)

Each protective film-forming layer formed on a PET film was observed by using a laser beam microscope (VK-8710, manufactured by KEYENCE CORP.), and a number of a concave defects, which were concave portions having a diameter of 50 μm or more and 300 μm or less and a depth of 10 μm or more, was counted. Here, a unit area to be observed was 1 m².

(Chipping Test)

The protective film-forming layer surface of the sheet for forming a protective film was laminated to a surface of a 220 μm-thick silicon wafer (a wafer obtained by subjecting a 8-inch unpolished wafer to #2000 polishing using DAG-810 manufactured by Disco Corp. to a thickness of 220 μm) at 70° C. by using an adhesive film laminating apparatus (manufactured by Technovision, trade name: FM-114). Thereafter, the PET film was delaminated from the protective film-forming layer to obtain a silicon wafer on which the protective film was formed. The silicon wafer was diced from the circuit-formed surface into chips of 10 mm×10 mm square under the following conditions. The cross-section of each of 8 obtained chips was micrographed. Then, when a crack or a chipping in a length of 25 μm or more was observed in the cross-section direction, this chip was rated as "chipped". The results are shown in Table 2 and Table 3.

[Dicing Conditions]
Apparatus: Disco Dicer DAD-341
Cutting method: single
Number of rotations of blade: 40,000 rpm
Blade speed: 50 mm/sec
Thickness of dicing film: 85 μm
Dicing depth in dicing film: 15 μm (Shear Adhesive Force Test)

After the protective film-forming layer surface of the sheet for forming a protective film was laminated to the back surface of a silicon wafer of 8 inch in diameter in the same manner as above, the base film was delaminated. Then, the wafer on which the protective film was laminated was cut into chips of 3 mm×3 mm square together with the protective film. Thereafter, each chip was picked up and bonded to the center part of a silicon wafer of 10 mm×10 mm by thermal compression for 1 second under the conditions of 170° C. and 0.63 MPa to obtain a laminate. The obtained laminate was heat-treated at 175° C. for 4 hours to cure the protective layer, thereby producing a test specimen. The shear adhesive force of each test specimen was measured using Dage 4000 manufactured by Dage Holdings Limited, under the condition that the speed was 200 μm/sec, the height was 50 μm and the specimen temperature was 260° C.

The results are shown in Table 2 and Table 3.

TABLE 2

| | | Example | | | | | | | |
|---|---|---|---|---|---|---|---|---|---|
| | | 1 | 2 | 3 | 4 | 5 | 6 | 7 | 8 |
| (A) Phenoxy Resin | JER1256 | 100 | 100 | 100 | 100 | 100 | 100 | 100 | 100 |
| (B) Epoxy Resin | RE310S | 100 | 100 | 100 | 100 | 100 | 100 | 100 | 100 |
| (C) Alkoxysilane-Partial Hydrolytic Condensate | A | 2 | 5 | 10 | | | 5 | | |
| | B | | | | 2 | 5 | 5 | 5 | 5 |
| | C | | | | | | | | |
| | D | | | | | | | | |
| (D) Curing Catalyst for Epoxy Resin | DICY-7 | 5 | 5 | 5 | 5 | 5 | 5 | 5 | 5 |
| (E) Inorganic Filler | SE2050 KBM-403 treatment | 200 | 200 | 200 | 200 | 200 | 200 | 200 | 200 |
| (F) Polar Solvent | cyclohexanone | 407 | 410 | 415 | 407 | 410 | 415 | 210 | 210 |
| | methyl isobutyl ketone | | | | | | | 50 | 100 |
| | methyl ethyl ketone | | | | | | | 150 | 100 |
| Characteristic Properties of Protective Film | | | | | | | | | |
| Sensory Evaluation of Appearance | | normal | normal | normal | normal | normal | normal | normal | normal |

TABLE 2-continued

|  |  | Example |  |  |  |  |  |  |  |
|---|---|---|---|---|---|---|---|---|---|
|  |  | 1 | 2 | 3 | 4 | 5 | 6 | 7 | 8 |
| Evenness Test | concave defect | 0 | 0 | 2 | 1 | 0 | 1 | 0 | 0 |
| Chipping | chipping of 25 μm or more | none | none | none | none | none | none | none | none |
| Shear Adhesive Force | 260° C. | 10 | 12 | 11 | 10 | 12 | 11 | 11 | 11 |

TABLE 3

|  |  | Comparative Example |  |  |  |  |  |  |
|---|---|---|---|---|---|---|---|---|
|  |  | 1 | 2 | 3 | 4 | 5 | 6 | 7 |
| (A) Phenoxy Resin | JER1256 | 100 | 100 | 100 | 100 | 100 | 100 | 100 |
| (B) Epoxy Resin | RE310S | 100 | 100 | 100 | 100 | 100 | 100 | 100 |
| (C) Alkoxysilane-Partial Hydrolytic Condensate | A |  | 0.5 | 40 |  |  |  |  |
|  | B |  |  |  | 0.5 | 40 |  |  |
|  | C |  |  |  |  |  | 10 |  |
|  | D |  |  |  |  |  |  | 10 |
| (D) Curing Catalyst for Epoxy Resin | DICY-7 | 5 | 5 | 5 | 5 | 5 | 5 | 5 |
| (E) Inorganic Filler | SE2050 KBM-403 treatment | 200 | 200 | 200 | 200 | 200 | 200 | 200 |
| (F) Polar Solvent | cyclohexanone methyl isobutyl ketone methyl ethyl ketone | 405 | 405.5 | 445 | 405.5 | 445 | 415 | 415 |
| Characteristic Properties of Protective Film |  |  |  |  |  |  |  |  |
| Sensory Evaluation of Appearance |  | normal | normal | uneven | normal | uneven | uneven | normal |
| Evenness Test | concave defect | 50 | 50 | 10 | 35 | 50 | 50 | 30 |
| Chipping | chipping of 25 μm or more | chipped | chipped | chipped | chipped | none | chipped | chipped |
| Shear Adhesive Force | 260° C. | 11 | 12 | 3 | 11 | 6 | 12 | 12 |

By using the adhesive composition of the present invention, a protective film excellent in evenness, cutting characteristics and adhesiveness could be formed (Examples 1 to 8). On the other hand, in the case of the adhesive composition not containing an alkoxysilane-partial hydrolytic condensate (Comparative Example 1), the adhesive compositions using alkoxysilane-partial hydrolytic condensate content was less than 1 part by mass or more than 20 parts by mass (Comparative Examples 2 to 5) and the adhesive compositions using the alkoxysilane-partial hydrolytic condensates C and D whose weight average molecular weight is not within the range of 300 or more and 30,000 or less (Comparative Examples 6 and 7), a concave defect or chipping was caused.

The present invention is not limited to the above embodiments. The above embodiments are merely illustrative, and whatever having the substantially same configurations as the technical concept recited in the claims of the present application and exhibiting the same functions and effects are embraced within the technical scope of the present invention.

What is claimed is:
1. An adhesive composition containing at least:
(A) 100 parts by mass of a phenoxy resin;
(B) 5 to 200 parts by mass of an epoxy resin having at least two epoxy groups in the molecule;
(C) 1 to 20 parts by mass of an alkoxysilane-partial hydrolytic condensate which is a partial hydrolytic condensate synthesized by a hydrolytic condensation reaction of alkoxysilane including at least one kind or two or more kinds of alkoxysilane represented by the following general formulae (1) and (2), wherein the weight average molecular weight is 300 or more and 30,000 or less and an amount of residual alkoxy is 2 wt % or more and 50 wt % or less,

$$Si(OR^3)_4 \quad (1)$$

$$R^1Si(OR^3)_3 \quad (2)$$

wherein $R^3$ represents an alkyl group having 1 to 3 carbon atoms, and $R^1$ represents an alkyl group having 1 to 3 carbon atoms, a phenyl group, an oxetanyl group, a vinyl group, a hydroxyl group, an aminoalkyl group, a (meth)acryloxyalkyl group, an isocyanatealkyl group or a γ-glycidoxyalkyl group, wherein the alkyl portion of said aminoalkyl group, said (meth)acryloxyalkyl group, said isocyanatealkyl group or said γ-glycidoxyalkyl group contains 1 to 3 carbon atoms, wherein each $R^1$ may be the same or different;
(D) an effective amount of a curing catalyst for an epoxy resin;
(E) 5 to 900 parts by mass relative to 100 parts by mass of the total amount of the above components (A), (B), (C) and (D) of an inorganic filler; and
(F) 10 to 300 parts by mass relative to 100 parts by mass of the total amount of the above components (A), (B), (C), (D) and (E) of a polar solvent having a boiling point of 80° C. to 180° C. and a surface tension of 20 to 30 dyne/cm at 25° C.

2. The adhesive composition according to claim 1, wherein the alkoxysilane-partial hydrolytic condensate of the component (C) is a partial hydrolytic condensate synthesized by a hydrolytic condensation reaction between one kind or two or more kinds of the alkoxysilane represented by the foregoing general formulae (1) and (2) and alkoxysilane represented by the following general formula (3),

$$R^2{}_2Si(OR^3)_2 \qquad (3)$$

wherein $R^3$ represents the same as above, and $R^2$ represents an alkyl group having 1 to 3 carbon atoms, a phenyl group, an oxetanyl group, a vinyl group, a hydroxyl group, an aminoalkyl group, a (meth)acryloxyalkyl group, an isocyanatealkyl group or a γ-glycidoxyalkyl group, wherein the alkyl portion of said aminoalkyl group, said (meth)acryloxyalkyl group, said isocyanatealkyl group or said γ-glycidoxyalkyl group contains 1 to 3 carbon atoms, wherein each $R^2$ may be the same or different.

3. A sheet for forming a protective film on a semiconductor wafer, said sheet comprising a base film and a protective film-forming layer; wherein the sheet is obtained by: applying the adhesive composition according to claim 2 on said base film; and drying the applied adhesive composition to remove the polar solvent of component (F), yielding said protective film-forming layer and said sheet.

4. The adhesive composition according to claim 2, wherein the curing catalyst for an epoxy resin of the component (D) is a phosphorus-based curing catalyst and/or an amine-based curing catalyst.

5. A sheet for forming a protective film on a semiconductor wafer, said sheet comprising a base film and a protective film-forming layer; wherein the sheet is obtained by: applying the adhesive composition according to claim 4 on said base film; and drying the applied adhesive composition to remove the polar solvent of component (F), yielding said protective film-forming layer and said sheet.

6. The adhesive composition according to claim 1, wherein the alkoxysilane-partial hydrolytic condensate of the component (C) is a partial hydrolytic condensate of one kind or two or more kinds of trialkoxysilane represented by the following general formula (4),

$$R^1Si(OR^3)_3 \qquad (4)$$

wherein $R^{3'}$ represents an alkyl group having 1 to 3 carbon atoms, and $R^{1'}$ represents an alkyl group having 1 to 3 carbon atoms, an aminoalkyl group, a (meth)acryloxyalkyl group, an isocyanatealkyl group or a γ-glycidoxyalkyl group, wherein the alkyl portion of said aminoalkyl group, said (meth)acryloxyalkyl group, said isocyanatealkyl group or said γ-glycidoxyalkyl group contains 1 to 3 carbon atoms.

7. A sheet for forming a protective film on a semiconductor wafer, said sheet comprising a base film and a protective film-forming layer; wherein the sheet is obtained by: applying the adhesive composition according to claim 6 on said base film; and drying the applied adhesive composition to remove the polar solvent of component (F), yielding said protective film-forming layer and said sheet.

8. The adhesive composition according to claim 6, wherein the curing catalyst for an epoxy resin of the component (D) is a phosphorus-based curing catalyst and/or an amine-based curing catalyst.

9. A sheet for forming a protective film on a semiconductor wafer, said sheet comprising a base film and a protective film-forming layer; wherein the sheet is obtained by: applying the adhesive composition according to claim 8 on said base film; and drying the applied adhesive composition to remove the polar solvent of component (F), yielding said protective film-forming layer and said sheet.

10. The adhesive composition according to claim 1, wherein the curing catalyst for an epoxy resin of the component (D) is a phosphorus-based curing catalyst and/or an amine-based curing catalyst.

11. A sheet for forming a protective film on a semiconductor wafer, said sheet comprising a base film and a protective film-forming layer: wherein the sheet is obtained by: applying the adhesive composition according to claim 10 on said base film; and drying the applied adhesive composition to remove the polar solvent of component (F), yielding said protective film-forming layer and said sheet.

12. A sheet for forming a protective film on a semiconductor wafer, said sheet comprising a base film and a protective film-forming layer; wherein the sheet is obtained by: applying the adhesive composition according to claim 1 on said base film; and drying the applied adhesive composition to remove the polar solvent of component (F), yielding said protective film-forming layer and said sheet.

* * * * *